United States Patent
Tokuhisa

(10) Patent No.: US 9,383,653 B2
(45) Date of Patent: Jul. 5, 2016

(54) ULTRAVIOLET LASER DEVICE, AND EXPOSURE DEVICE AND INSPECTION DEVICE PROVIDED WITH ULTRAVIOLET LASER DEVICE

(71) Applicant: NIKON CORPORATION, Tokyo (JP)

(72) Inventor: Akira Tokuhisa, Tokyo (JP)

(73) Assignee: NIKON CORPORATION, Tokyo (JP)

(*) Notice: Subject to any disclaimer, the term of this patent is extended or adjusted under 35 U.S.C. 154(b) by 91 days.

(21) Appl. No.: 14/382,093

(22) PCT Filed: Mar. 5, 2013

(86) PCT No.: PCT/JP2013/056011
§ 371 (c)(1),
(2) Date: Dec. 1, 2014

(87) PCT Pub. No.: WO2013/133279
PCT Pub. Date: Sep. 12, 2013

(65) Prior Publication Data
US 2015/0116680 A1    Apr. 30, 2015

(30) Foreign Application Priority Data
Mar. 5, 2012    (JP) .................... 2012-048210

(51) Int. Cl.
*G03B 27/54*    (2006.01)
*G03F 7/20*    (2006.01)
(Continued)

(52) U.S. Cl.
CPC ............ *G03F 7/70191* (2013.01); *G02F 1/353* (2013.01); *G02F 1/3534* (2013.01);
(Continued)

(58) Field of Classification Search
CPC .................................................. G03F 7/70191
USPC ........................... 355/53, 67–71; 372/20–22
See application file for complete search history.

(56) References Cited

U.S. PATENT DOCUMENTS 7,136,402 B1 * 11/2006 Ohtsuki .................... G02F 1/37
                                                                    372/22
7,653,096 B2 * 1/2010 Kawai ....................... G03F 1/84
                                                                    372/22

(Continued)

FOREIGN PATENT DOCUMENTS

JP    A-2000-171843    6/2000
JP    A-2004-86193    3/2004
(Continued)

OTHER PUBLICATIONS

Jun. 11, 2013 International Search Report issued in International Application PCT/JP2013/056011 (with translation).

*Primary Examiner* — Hung Henry Nguyen
(74) *Attorney, Agent, or Firm* — Oliff PLC

(57) ABSTRACT

An ultraviolet laser device, includes: a first laser light output unit outputs a first infrared laser light; a second laser light output unit outputs a second infrared laser light; a first wavelength conversion optical system generates a first ultraviolet laser light of a fifth harmonic of the first infrared laser light; and a second wavelength conversion optical system to which the first ultraviolet laser light and the second infrared laser light enter, wherein the second wavelength conversion optical system includes a first wavelength conversion optical element which generates a second ultraviolet laser light by sum frequency generation of the first ultraviolet laser light and the second infrared laser light, and a second wavelength conversion optical element which generates a deep ultraviolet laser light by sum frequency generation of the second ultraviolet laser light and the second infrared laser light.

13 Claims, 6 Drawing Sheets

(51) Int. Cl.
*H01S 3/23* (2006.01)
*H01S 3/00* (2006.01)
*G02F 1/35* (2006.01)
*H01S 3/067* (2006.01)
*H01S 3/16* (2006.01)

(52) U.S. Cl.
CPC .......... *G03F 7/70025* (2013.01); *H01S 3/0092* (2013.01); *H01S 3/2391* (2013.01); *G02F 2001/3507* (2013.01); *H01S 3/06754* (2013.01); *H01S 3/1608* (2013.01); *H01S 3/1618* (2013.01)

(56) References Cited

U.S. PATENT DOCUMENTS

| | | |
|---|---|---|
| 2007/0263679 A1 | 11/2007 | Staroudoumov et al. |
| 2007/0263680 A1 | 11/2007 | Starodoumov et al. |
| 2013/0170509 A1 | 7/2013 | Tokuhisa |

FOREIGN PATENT DOCUMENTS

| | | |
|---|---|---|
| JP | A-2007-86108 | 4/2007 |
| JP | A-2010-93210 | 4/2010 |
| WO | WO 2011/158927 A1 | 12/2011 |

* cited by examiner

ULTRAVIOLET LASER DEVICE, AND EXPOSURE DEVICE AND INSPECTION DEVICE PROVIDED WITH ULTRAVIOLET LASER DEVICE

TECHNICAL FIELD

The present invention relates to an ultraviolet laser device comprising a laser light output unit that outputs a laser light of infrared wavelength and a wavelength conversion optical system that converts an infrared laser light output from the laser light output unit to an ultraviolet laser light, and outputting a deep ultraviolet laser light with a wavelength of 200 nm or less.

BACKGROUND ART

A deep ultraviolet laser light with a wavelength of 200 nm or less is known to be applied to exposure devices, inspection devices, therapy devices, and so on. A variety of configurations of an ultraviolet laser device for use in these devices have been proposed. For example, an ultraviolet laser device, in which, a seed light of an infrared wavelength emitted from a laser light source is amplified by an erbium doped fiber amplifier (EDFA), then the amplified infrared laser light is sequentially wavelength-converted through a plurality of wavelength conversion elements, for outputting a deep ultraviolet laser light with a wavelength of 200 nm or less, is known (refer to Patent Document #1 and Patent document #2). An ultraviolet laser device with this kind of configuration is an easily handled, small-scale, and all-solid ultraviolet laser device.

CITATION LIST

Patent Literature

Patent Document #1: Japanese Laid-Open Patent Publication No. 2004-86193;
Patent Document #2: Japanese Laid-Open Patent Publication No. 2010-93210;

SUMMARY OF THE INVENTION

Technical Problem

However, the proposed ultraviolet laser device has a complex configuration. The present invention provides an ultraviolet laser device with a novel and simple configuration, which is able to output a deep ultraviolet laser light with a wavelength of 200 nm or less. Further, the present invention provides an exposure device, an inspection device, and the like, comprising the ultraviolet laser device of the novel configuration.

Solution to Problems

According to the first aspect of the present invention, an ultraviolet laser device, comprises: a first laser light output unit that outputs a first infrared laser light with a wavelength within a wavelength band of 1520 to 1580 nm; a second laser light output unit that outputs a second infrared laser light with a wavelength within a wavelength band of 1020 to 1100 nm; a first wavelength conversion optical system that includes a plurality of wavelength conversion optical elements and generates a first ultraviolet laser light which is a fifth harmonic of the first infrared laser light by sequentially wavelength converting, by the plurality of wavelength conversion optical elements, the first infrared laser light output from the first laser light output unit; and a second wavelength conversion optical system to which the first ultraviolet laser light generated by the first wavelength conversion optical system and the second infrared laser light output from the second laser light output unit enter, wherein the second wavelength conversion optical system comprises a first wavelength conversion optical element that generates a second ultraviolet laser light by sum frequency generation of the first ultraviolet laser light and the second infrared laser light, and a second wavelength conversion optical element that generates a deep ultraviolet laser light with a wavelength equal to or less than 200 nm by sum frequency generation of the second ultraviolet laser light and the second infrared laser light.

According to the second aspect of the present invention, in the ultraviolet laser device according to the first aspect, it is preferred that the second infrared laser light output from the second laser light output unit includes a first polarization component and a second polarization component wherein the plane of polarization of the first polarization component and the plane of polarization of the second polarization component are mutually orthogonal; the first wavelength conversion optical element generates the second ultraviolet laser light by sum frequency generation of the first ultraviolet laser light and the first polarization component of the second infrared laser light; and the second wavelength conversion optical element generates the deep ultraviolet laser light by sum frequency generation of the second ultraviolet laser light and the second polarization component of the second infrared laser light.

According to the third aspect of the present invention, in the ultraviolet laser device according to the first or second aspect, it is preferred that the first wavelength conversion optical element is an ADP crystal.

According to the fourth aspect of the present invention, in the ultraviolet laser device according to any one of the first through third aspects, it is preferred that phase matching at the first wavelength conversion element is non-critical phase matching.

According to the fifth aspect of the present invention, in the ultraviolet laser device according to any one of the first through fourth aspects, it is preferred that the second wavelength conversion optical element is a CLBO crystal.

According to the sixth aspect of the present invention, in the ultraviolet laser device according to any one of the first through fifth aspects, it is preferred that phase matching at the second wavelength conversion optical element is non-critical phase matching.

According to the seventh aspect of the present invention, in the ultraviolet laser device according to any one of the first through sixth aspects, it is preferred that the first laser light output unit comprises an erbium doped fiber amplifier.

According to the eighth aspect of the present invention, in the ultraviolet laser device according to any one of the first through seventh aspects, it is preferred that the second laser light output unit comprises an ytterbium doped fiber amplifier.

According to the ninth aspect of the present invention, in the ultraviolet laser device according to any one of the second through eighth aspects, it is preferred that the second laser light output unit further comprises a laser light source that emits a seed light with a wavelength within a wavelength band of 1020 to 1100 nm and a fiber amplifier that amplifies the seed light emitted from the laser light source; and a light emitted from the fiber amplifier becomes the second infrared laser light including the first polarization component and the second polarization component, and then is output from the second laser light output unit.

According to the tenth aspect of the present invention, in the ultraviolet laser device according to any one of the second through eighth aspects, it is preferred that the second laser light output unit further comprises a laser light source that emits a seed light with a wavelength within a wavelength band of 1020 to 1100 nm, a first fiber amplifier that amplifies the seed light emitted from the laser light source, and a second fiber amplifier that amplifies the seed light emitted from the laser light source; and a light emitted from the first fiber amplifier becomes the second infrared laser light including the first polarization component and is output from the second laser light output unit; and a light emitted from the second fiber amplifier becomes the second infrared laser light including the second polarization component and is output from the second laser light output unit.

According to the eleventh aspect of the present invention, in the ultraviolet laser device according to any one of the second through eighth aspects, it is preferred that the second laser light output unit further comprises a first laser light source that emits a first seed light with a wavelength within a wavelength band of 1020 to 1100 nm, a first fiber amplifier that amplifies the first seed light emitted from the first laser source, a second laser source that emits a second seed light with a wavelength within a wavelength band of 1020 to 1100 nm, and a second fiber amplifier that amplifies the second seed light emitted from the second laser source; a light emitted from the first fiber amplifier becomes the second infrared laser light including the first polarization component and is output from the second laser light output unit; and a light emitted from the second fiber amplifier becomes the second infrared laser light including the second polarization component and is output from the second laser light output unit.

According to the twelfth aspect of the present invention, an exposure device comprises: the ultraviolet laser device according to any one of the first through eleventh aspects; a photomask supporting unit that holds a photomask on which a predetermined exposure pattern is formed; an exposure object supporting unit that holds an exposure object; an illumination optical system that illuminates the photomask held by the photomask supporting unit with a deep ultraviolet laser light output from the ultraviolet laser device; and a projection optical system that projects a light transmitted through the photomask to the exposure object held by the exposure object supporting unit.

According to the thirteenth aspect of the present invention, an inspection device comprises: the ultraviolet laser device according to any one of the first through eleventh aspects; an object supporting unit that holds an object to be inspected; an illumination optical system that illuminates the object held by the object supporting unit with a deep ultraviolet laser light output from the ultraviolet laser device; and a projection optical system that projects a light from the object to a detector.

Advantageous Effect of the Invention

According to the ultraviolet laser device of the present invention, an ultraviolet laser device of a novel configuration, which is able to output a deep ultraviolet laser light with a wavelength of 200 nm or less, can be provided.

According to the exposure device of the present invention, an exposure device comprising an ultraviolet laser device of a novel configuration can be provided. Also, according to the inspection device of the present invention, an inspection device comprising an ultraviolet laser device of a novel configuration can be provided.

DESCRIPTION OF EMBODIMENTS

Figure 1:
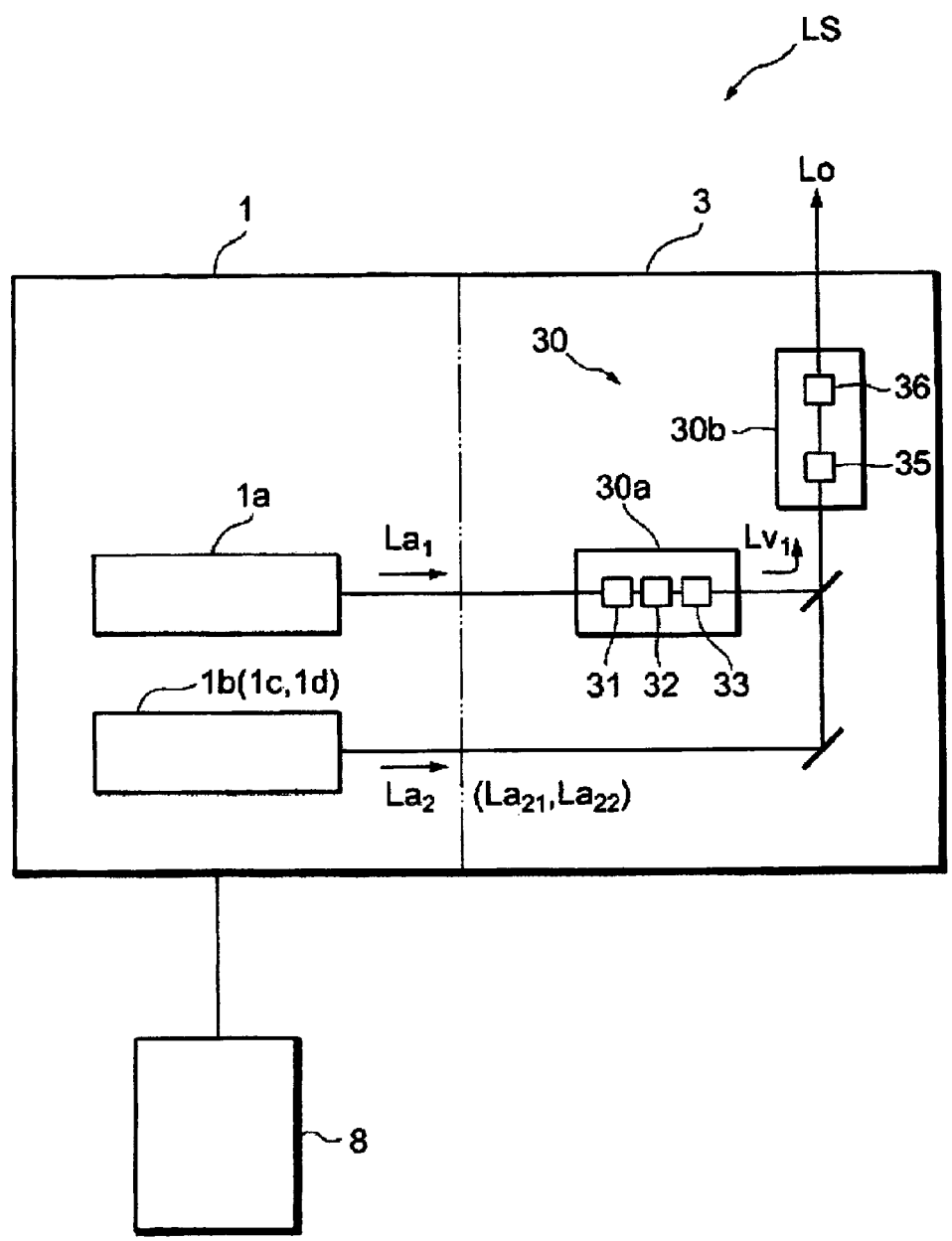
FIG. 1 is a block diagram of an ultraviolet laser device in an embodiment of the present invention.

The following is a description of the present invention given in reference to drawings. FIG. 1 illustrates a block diagram of an ultraviolet laser device LS (LS1~LS3) exemplified as an embodiment of the present invention. The ultraviolet laser device LS comprises laser light output units 1 that outputs infrared laser lights La (La1, La2), a wavelength conversion unit 3, comprising a plurality of wavelength conversion optical elements, that outputs deep ultraviolet laser light Lo by applying wavelength conversion to the infrared laser light La output from the laser light output unit 1, a control unit 8 that controls an operation of the laser light output unit 1 and the wavelength conversion unit 3, and so on.

A laser light output unit 1 comprises a first laser light output unit 1a that outputs a first infrared laser light La1 with a wavelength range of 1520~4580 nm and a second laser light output unit 1b that outputs a second infrared laser light La2 with a wavelength range of 1020~1100 nm. The specific wavelengths of the first infrared laser light La1 and the second infrared laser light La2 can be set in accordance with the wavelength of the deep ultraviolet laser light Lo output from the ultraviolet laser device LS and the configuration of the wavelength conversion unit 3.

A wavelength conversion unit 3 is provided with a wavelength conversion optical system 30, which comprises a plurality of wavelength conversion optical elements, condenser lenses, mirrors, and so on. The wavelength conversion optical system 30 comprises a first wavelength conversion optical system 30a to which the first infrared laser light La1 output from the first laser light output unit 1a enters, and a second wavelength conversion optical system 30b to which the second infrared laser light La2 output from the second laser light output unit 1b and an output light from the first wavelength conversion optical system 30a both enter.

The first wavelength conversion optical system 30a is provided with three wavelength conversion optical elements 31, 32 and 33. The first infrared laser light La1 output from the first laser light output unit 1a is sequentially wavelength-converted during transmitting through these wavelength conversion optical elements 31, 32 and 33, then a first ultraviolet laser light Lv1 which is the fifth harmonic of the first infrared laser light La1 is generated.

The second wavelength conversion optical system 30b is provided with two wavelength conversion optical elements 35 and 36. At the wavelength conversion optical element 35, a second ultraviolet laser light Lv2 is generated by sum frequency generation of the first ultraviolet laser light Lv1 output from the first wavelength conversion optical system 30a and the second infrared laser light La2 output from the second laser light output unit 1b. At the wavelength conversion optical elements 36, by sum frequency generation of the second ultraviolet laser light Lv2 generated at the wavelength conversion optical element 35 and the second infrared laser light La2 transmitted through the wavelength conversion optical element 35, a deep ultraviolet laser light Lo with a wavelength of 200 nm or less is generated and output from the ultraviolet laser device LS. In the ultraviolet laser device LS constituted as outlined above, a deep ultraviolet laser light can be output with a simple configuration involving a single superposition of laser lights.

In the following, specific configuration examples are described with reference to FIGS. 2-4 respectively illustrating a schematic configuration of the ultraviolet laser devices LS1-LS3, respectively corresponding to a first through a third configuration examples. In the figures, in order to describe the polarization states of lights which enter into each of the wavelength conversion optical elements, a light with its polarization plane parallel to the page, so called p-polarization, is shown by an arrow in vertical direction, and light with its polarization plane perpendicular to the page, so called s-polarization, is shown by a round mark with a dot in the center. Also, in each figure, an ellipse on the optical path indicates a collimator lens, condenser lens, or the like, of which individual explanation is omitted.

Figure 2:
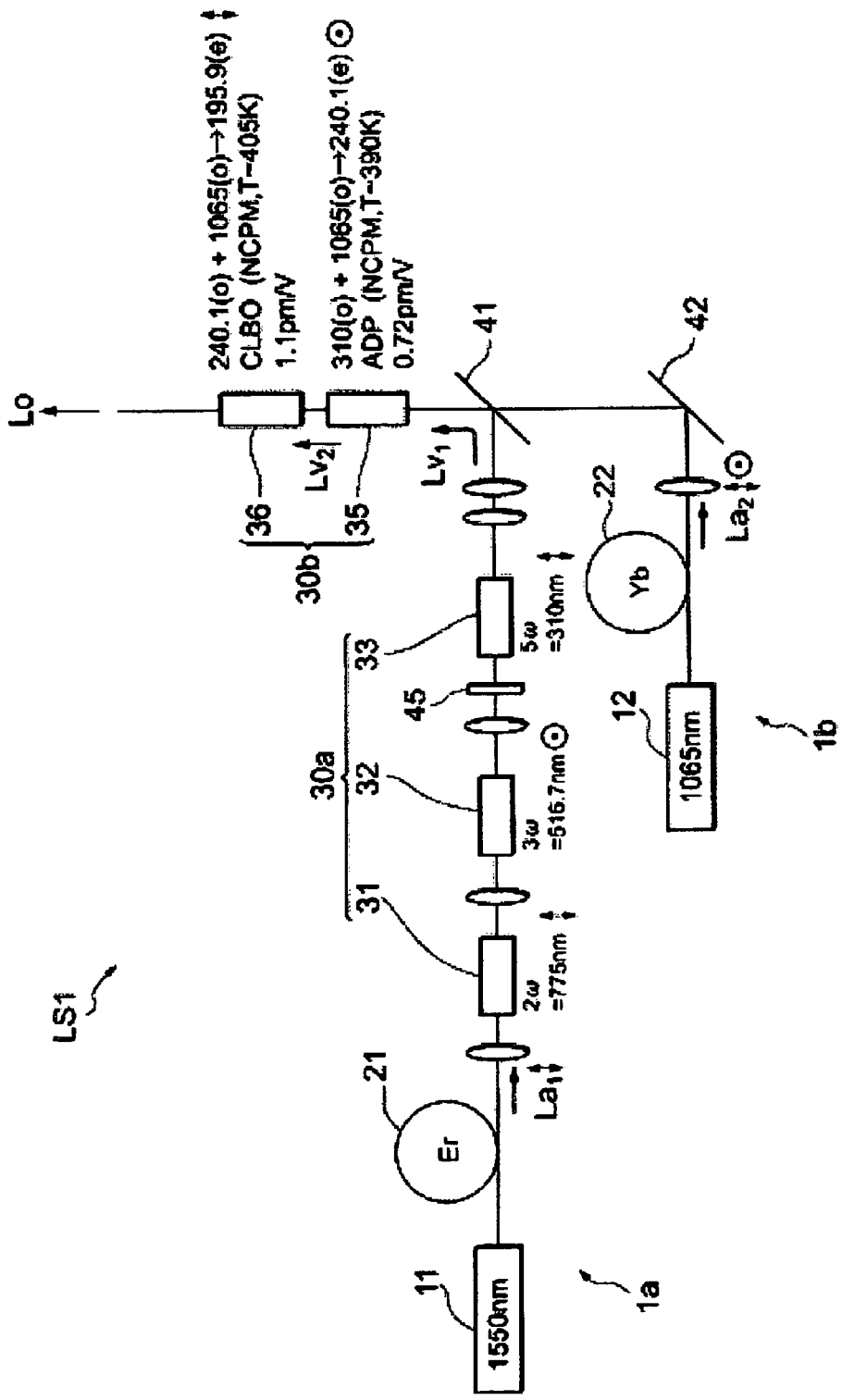
FIG. 2 is a schematic configuration diagram of an ultraviolet laser device of a first configuration example.

In the ultraviolet laser device LS1 as a first configuration example shown in FIG. 2, the first laser light output unit 1a is provided with a first laser light source 11 that emits a seed light with a wavelength of 1550 nm and a first fiber amplifier 21 that amplifies the seed light output from the first laser light source 11. Also, the second laser light output unit 1b is provided with a second laser light source 12 that emits a seed light with a wavelength of 1065 nm and a second fiber amplifier 22 that amplifies the seed light output from the second laser light source 12.

As the first laser light source 11, DFB (Distributed Feedback) semiconductor laser with oscillation wavelength around 1550 nm, and as the second laser light source 12, DFB semiconductor laser with oscillation wavelength around 1065 nm, can suitably be used, respectively. A DFB semiconductor laser, under temperature controlling by a temperature controller using Peltier device or the like, can narrow the bandwidth of the oscillation wavelength, so as to generate a single-wavelength seed light. Also, a DFB semiconductor laser, by controlling a waveform of the excitation current, can perform a CW oscillation or a pulse oscillation at an arbitrary intensity.

It is also possible to set up an external modulator such as EOM (Electro Optic Modulator) between an output port of the DFB semiconductor laser of the first laser source 11 and the first fiber amplifier 21, for cutting out the output light from the DFB semiconductor laser, in a CW oscillation or a pulse oscillation, by the external modulator so as to output a seed light of required pulse waveform towards the first fiber amplifier 21. The configuration mentioned above can also be applied for the second laser light source 12.

As the first fiber amplifier 21, an erbium doped fiber amplifier (EDFA), in which erbium (Er) is doped in the core of the amplifying optical fiber can suitably be used. An erbium doped fiber amplifier has a gain in a 1500~1600 nm wavelength band. As a result, a seed light with a wavelength of 1520~1580 nm can be efficiently amplified, and a high-power first infrared laser light can be output.

In the present configuration example, the seed light with a wavelength of 1550 nm emitted from the first laser light source 11 is amplified by the first fiber amplifier 21, then the amplified first infrared laser light La1 is output from the first laser light output unit 1a. The first infrared laser light La1, with a wavelength of 1550 nm, output from the first laser light output unit 1a, enter the first wavelength conversion optical system 30a of the wavelength conversion unit 3.

As the second fiber amplifier 22, an ytterbium doped fiber amplifier (YDFA), in which ytterbium (Yb) is doped in the core of the amplifying optical fiber, can suitably be used. An ytterbium doped fiber amplifier has a gain in a 1000~1120 nm wavelength band. As a result, a seed light with a wavelength of 1020~4100 nm can be efficiently amplified, and a high-power second infrared laser light can be output.

In the present configuration example, the seed light with a wavelength of 1065 nm emitted from the second laser light source 12 is amplified by the second fiber amplifier 22, then the amplified second infrared laser light La2 is output from the second laser light output unit 1b. The second infrared laser light La2, with a wavelength of 1065 nm, output from the second laser light output unit 1b, enter a dichroic mirror 41 by way of a mirror 42.

In the above description, a configuration is exemplified in which the first laser light output unit 1a is provided with the first laser light source 11 and the first fiber amplifier 21, while the second laser light output unit 1b is provided with the second laser light source 12 and the second fiber amplifier 22. However, each laser light output unit, at least one of them, may be provided with a fiber laser in which resonators are embedded in the incident end and the exiting end of a fiber amplifier (an Er fiber laser or a Yb fiber laser is suitable for the fiber laser).

The first wavelength conversion optical system 30a to which the first infrared laser light La1 output from the first laser light output unit 1a enters mainly comprises three wavelength conversion optical elements 31, 32 and 33. In the first wavelength conversion optical system 30a, after entering to which, the first infrared laser light La1 is sequentially wavelength-converted during transmitting through the wavelength conversion optical elements 31, 32 and 33, and then the first ultraviolet laser light Lv1, corresponding to the fifth harmonic of the first infrared laser light La1, is generated.

The wavelength conversion optical element 31 is, a non-linear optical crystal that generates a second harmonic of the first infrared laser light La1 by second harmonic generation (SHG). After entering the wavelength conversion optical element 31, the p-polarized first infrared laser light La1 with a wavelength of 1550 nm is wavelength-converted during transmitting through the wavelength conversion optical elements 31, and then a p-polarized laser light with a wavelength of 775 nm (hereafter referred to as 775 nm light) is generated. A PPLN (Periodically Poled $LiNbO_3$) crystal can suitably be used as the wavelength conversion optical element 31.

Quasi phase matching (QPM) crystals such as PPLT (Periodically Poled $LiTaO_3$) crystal and PPKTP (Periodically Poled $KTiOPO_4$) crystal may be used as well. Also, LBO ($LiB_3O_5$) crystal may be used. The p-polarized 775 nm light generated in the wavelength conversion optical element 31 and the p-polarized first infrared laser light La1 transmitted through the wavelength conversion optical element 31 enter the wavelength conversion optical element 32.

The wavelength conversion optical element 32 is a non-linear optical crystal that generates a sum frequency light of the first infrared laser light La1 and the 775 nm light by sum frequency generation (SFG). After entering the optical element 32, the p-polarized first infrared laser light La1 and the p-polarized 775 nm light are wavelength-converted during transmitting through the wavelength conversion optical element 32, and then an s-polarized laser light with a wavelength of 516.7 nm (hereafter referred to as 517 nm light), corresponding to a third harmonic of the first infrared laser light, is generated. An LBO crystal can suitably be used as the wavelength conversion element 32. The s-polarized 517 nm light generated in the wavelength conversion optical element 32 and the p-polarized 775 nm light transmitted through the wavelength conversion optical element 32, enter the wavelength conversion optical element 33 as s-polarized lights after passing through a dual wavelength wave plate 45 in which only the 775 nm light is subject to the 90-degree rotation of its polarization plane.

The wavelength conversion optical element 33 is a non-linear optical crystal that generates a sum frequency light of the 775 nm light and the 517 nm light by sum frequency generation (SFG). After entering the wavelength conversion element 33, the 775 nm light (the second harmonic of the first infrared laser light) and the 517 nm light (the third harmonic of the first infrared laser light), both of which are s-polarized lights, are wavelength-converted during transmitting through the wavelength conversion optical element 33, and then a p-polarized first ultraviolet laser light Lv1 with a wavelength of 310 nm, namely a fifth harmonic of the first infrared laser light, is generated. A BBO (beta-$BaB_2O_4$) crystal can suitably be used as the wavelength conversion element 33. Because of the beam section of the first ultraviolet laser light Lv1, emitting from BBO crystals, is elliptical due to the walk-off, it is roundly shaped by cylindrical lenses before the light is allowed to enter the first surface of the dichroic mirror 41.

The second infrared laser light La2 with a wavelength of 1065 nm, output from the second laser light output unit 1b, enters the second surface of the dichroic mirror 41. The second infrared laser light La2, which enters the dichroic mirror 41, is configured such that the ratio of the p-polarized light component and the s-polarized light component is appropriate (for example, the s-polarized component: the p-polarized component=50:50). To realize this configuration, for example, a linearly-polarized second infrared laser light La2 is output from the second fiber amplifier 22, then, the polarization plane thereof is rotated by a half-wave plate or the like, before it enters the dichroic mirror 41, and adjusted so that the angle of the polarization plane thereof is to be 45 degrees to both of the directions of the p-polarized light and the s-polarized light. Alternatively, this configuration can also be realized by letting a circularly polarized second infrared laser light La2 output from the second fiber amplifier 22 enter the dichroic mirror 42.

The dichroic mirror 41 is configured to have wavelength-selectivity in which a light in a wavelength band in the first ultraviolet laser light Lv1 is reflected and a light in a wavelength band of the second infrared laser light La2 is transmitted. The reflection wavelength band of the dichroic mirror 41 can be arbitrarily changed as long as it is shorter than the wavelength of the second infrared laser light La2 and includes the wavelength of the first ultraviolet laser light Lv1. For example, the reflection wavelength band can be set below 350 nm~400 nm or so. By setting the wavelength band in such a way, the first ultraviolet laser light Lv1 included in the light emitted from the first wavelength conversion unit 30a and the other component of the light with different wavelength (the first infrared laser light, the 775 nm light, and the 517 nm light) can be separated by the use of the dichroic mirror 41. This will enable us to avoid the incidence of the laser light with an unnecessary wavelength to the second wavelength conversion optical system 30b and to avoid emitting of the laser light with an unnecessary wavelength from the second wavelength conversion optical element 30b.

After entering the first surface of the dichroic mirror 41, the first ultraviolet laser light Lv1 with a wavelength of 310 nm, is reflected at the dichroic mirror 41, and then enter the wavelength conversion optical element 35 of the wavelength conversion optical system 30b. In addition, after entering the second surface of the dichroic mirror 41, the second infrared laser light La2, which includes the p-polarized light component and the s-polarized light component, passes through the dichroic mirror 41 and is superposed coaxially on the first ultraviolet laser light Lv1, then enters the wavelength conversion optical element 35 of the second wavelength conversion optical system 30b.

The wavelength conversion optical element 35 is a non-linear optical crystal that generates a sum frequency light of the first ultraviolet laser light Lv1 and the second infrared laser light La2 by sum frequency generation (SFG). In the present configuration example, an ADP ($NH_4H_2PO_4$) crystal is used as the wavelength conversion optical element 35. In the case of using an ADP crystal, by maintaining the temperature of the APD crystal at 390K, a phase matching condition is satisfied in Non-Critical Phase Matching (NCPM). Also, a CLBO ($CsLiB_6O_{10}$) crystal can suitably be used as the wavelength conversion optical element 35.

In the wavelength conversion optical element 35, the s-polarized second ultraviolet laser light Lv2 with a wavelength of 240.1 nm is generated by sum frequency generation of the p-polarized first ultraviolet laser light Lv1 with a wavelength of 310 nm and the p-polarized component of the second infrared laser light La2 with a wavelength of 1065 nm. Here, the effective non-linear optical constant deff of the ADP crystal is relatively high as deff=0.72 pm/V, which makes it efficient to generate the second ultraviolet laser light Lv2. Also, because phase matching is in the non-critical phase matching (NCPM), it prevents a generation of walk-off. Therefore, the second ultraviolet laser light Lv2 of excellent beam quality can be obtained efficiently, and, the spatial superposition of the second ultraviolet laser light Lv2 generated in the wavelength conversion optical element 35 and the second infrared laser light La2 transmitted through the wavelength conversion optical element 35 is maintained in an excellent condition.

Herewith, without providing optical elements such as a beam forming optical system and a wave plate between the wavelength conversion optical element 35 and the wavelength conversion optical element 36 where the wavelength band is in the ultraviolet region, the efficient wavelength-conversion can be done by the wavelength conversion optical element 36 of the next stage. The s-polarized second ultraviolet laser light Lv2 generated in the wavelength conversion optical element 35 and the s-polarized component of the second infrared laser light La2 transmitted through the wavelength conversion optical element 35 enter the wavelength conversion optical element 36.

The wavelength conversion optical element 36 is a non-linear optical crystal that generates a sum frequency light of the second ultraviolet laser light Lv2 and the second infrared laser light La2 by sum frequency generation (SFG). In the present configuration example, a CLBO crystal is used as the wavelength conversion optical element 36. In the case of using a CLBO crystal, by maintaining the temperature of the CLBO crystal at 405K, a phase matching condition is satisfied in non-critical phase matching (NCPM).

In the wavelength conversion element 36, the p-polarized deep ultraviolet laser light Lo with a wavelength of 195.9 nm is generated by sum frequency generation of the s-polarized second ultraviolet laser light Lv2 with a wavelength of 240.1 nm and the s-polarized component of the second infrared laser light La2 with a wavelength of 1065 nm. Here, the effective non-linear optical constant deff of the CLBO crystal is as high as deff=1.1 pmN, which makes it efficient to generate the deep ultraviolet laser light Lo. Also, for phase matching, the non-critical phase matching (NCPM) prevents the generation of walk-off. Therefore, the deep ultraviolet laser light Lo of excellent beam quality can be obtained efficiently. Herewith, without providing a beam forming optical system in the emitting side of the wavelength conversion optical element 36 where the wavelength band is in a deep ultraviolet region with a wavelength below 200 nm, the deep ultraviolet laser light Lo of excellent quality can be output.

The deep ultraviolet laser light Lo with a wavelength of 195.9 nm generated at the wavelength conversion optical element 36, is emitted from the second wavelength conversion optical system 30b, then is output from the ultraviolet laser device LS1.

In the ultraviolet laser device LS1, a light having mutually orthogonal two polarization components is emitted from the second laser light output unit 1b, then one polarization component (p-polarized component) is used for the wavelength-conversion at the wavelength conversion optical element 35 and the other (s-polarized component) is used for the wavelength-conversion at the wavelength conversion optical element 36, so that the deep ultraviolet laser light Lo with a wavelength of 195.9 nm is output. Herewith, an ultraviolet laser device that outputs the deep ultraviolet laser light with a wavelength below 200 nm can be provided in a simple and reasonable configuration.

Additionally, erbium doped fiber amplifiers (EDFA) can amplify, with comparative ease, a light with a wavelength of 1550 nm, which the light to be amplified at the first fiber amplifier 21 has. Also, ytterbium doped fiber amplifiers (YDFA) can amplify, with comparative ease, a light with a wavelength of 1065 nm, which the light to be amplified at the second fiber amplifier 22 has. Therefore, by using EDFA as the first fiber amplifier 21 and YDFA as the second fiber amplifier 22, the first laser light output unit 1a and the second laser light output unit 1b can be high-powered and stable, by which high-power and stable ultraviolet laser device is provided.

Furthermore, in the ultraviolet laser device LS1, the non-critical phase matching at the both wavelength conversion optical elements 35 and 36 prevent the generation of walk-off. Therefore, an ultraviolet laser device that outputs deep ultraviolet laser light Lo with high output efficiency and excellent beam quality can be provided without providing a beam forming optical system or the like, between the wavelength conversion optical element 35 and the wavelength conversion optical element 36 or in the emitting side of the wavelength conversion optical element 36 or the like.

Obviously, in the case that a pulsed deep ultraviolet laser light Lo is output from the ultraviolet laser device LS1, both the first and the second ultraviolet laser lights are set to be temporally superposed on the second infrared laser light at the wavelength conversion optical element 35 and 36. Specifically, the timing of generation of these pulse lights are adjusted, or the optical paths of the routes of these two pulse lights are adjusted so that the timing of the incidence of the first ultraviolet laser light, originating from the pulse light (seed light) generated at the first laser light source 11, into the wavelength conversion optical element 35 is synchronized with the timing of the incidence of the second infrared laser light, originating from the pulse light (seed light) generated at the second laser light source 12, into the wavelength conversion optical element 35.

Configuration Example #2

Figure 3:
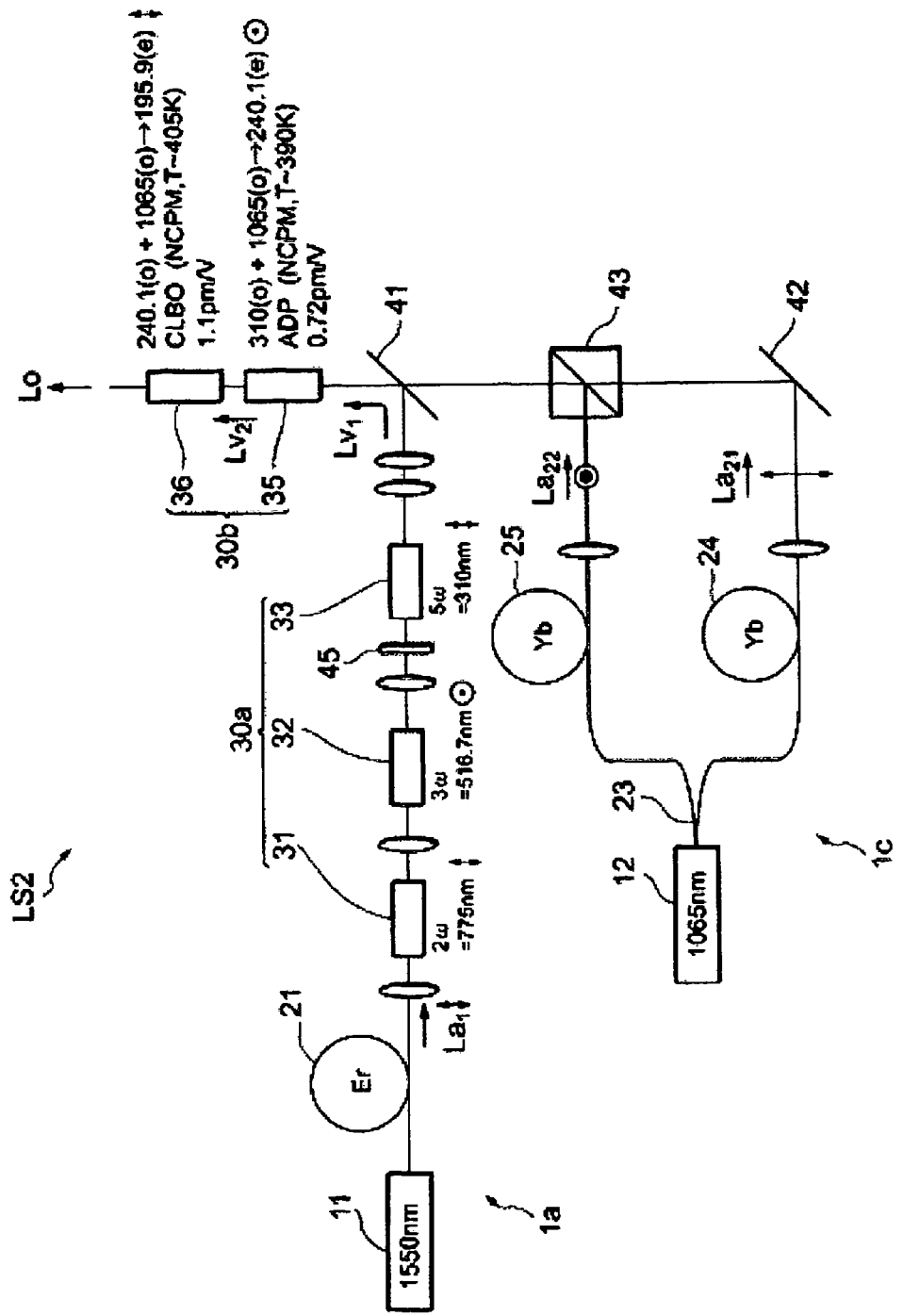
FIG. 3 is a schematic configuration diagram of an ultraviolet laser device of a second configuration example.

Next, with reference to FIG. 3, the ultraviolet laser device LS2 of as a second configuration example is described. The ultraviolet laser device LS2 as the second configuration example is the same as the ultraviolet laser device LS1 as the first configuration example described above, except the configuration of the second laser light output unit. Namely, the first laser light output unit 1a, the first wavelength conversion optical system 30a (wavelength conversion optical elements 31, 32 and 33), the second wavelength conversion optical system 30b (wavelength conversion optical elements 35 and 36) and the like are the same as the configuration described with reference to FIG. 2. Then, to similar structural elements in FIG. 3, the same reference symbols are appended, and duplicated explanation is omitted. In the following, the ultraviolet laser device LS2 as the second configuration example is described with a focus on the second laser light output unit 1c, which differs from the second laser light output unit of the first configuration example.

The second laser light output unit 1c is provided with a second laser light source 12 that emits a seed light with a wavelength of 1065 nm, a fiber-type beam splitter 23 that divides the seed light output from the second laser light source 12 in two, a 2-1 fiber amplifier 24 that amplifies one divided seed light, and a 2-2 fiber amplifier 25 that amplifies the other divided seed light.

Ytterbium doped fiber amplifier (YDFA), in which ytterbium (Yb) is doped in the core of the amplifying optical fiber, can suitably be used as the 2-1 fiber amplifier 24 and the 2-2 fiber amplifier 25. And, in the present configuration example, a polarization maintaining fiber (PMF) can suitably be used as the amplifying fiber in the fiber amplifiers 24 and 25.

The seed lights with a wavelength of 1065 nm emitted from the second laser light source 12 are respectively amplified by the 2-1 fiber amplifier 24 and the 2-2 fiber amplifier 25, then a linearly-polarized, second infrared laser light La21 and a linearly-polarized second infrared laser light La22 are output from the second laser light output unit 1c.

The second infrared laser light La21 emitting from the 2-1 fiber amplifier 24 and the second infrared laser light La22 emitting from the 2-2 fiber amplifier 25 are adjusted to enter the dichroic mirror 41 as a p-polarized light and an s-polarized light, respectively. As a specific adjusting means, for one example, the polarization plane of the linearly-polarized beam emitted from each fiber amplifier is rotated by a half-wave plate (not shown in figure). For another example, a rotation of the exiting end of each fiber amplifier around the optical axis is exemplified as the adjustment.

The second infrared laser light La22, adjusted to be an s-polarized light, emitted from the 2-2 fiber amplifier 25 enter a polarization beam combiner 43. And, the second infrared laser light La21, adjusted to be a p-polarized light, emitted from the 2-2 fiber amplifier 24 enter the polarization beam combiner 43 by way of a mirror 42, to be coaxially superposed on the second infrared laser light La22.

The polarization beam combiner 43 is a polarization optical element (or a polarization beam splitter, in the case that the incidence side and the emission side are reversed) that reflects a s-polarized component of the light and transmits a p-polarized component of the light in a wavelength band of 1065 nm. Therefore, the s-polarized second infrared laser light La22 emitted from the 2-2 fiber amplifier 25, is reflected by the polarization beam combiner 43, and then enters the dichroic mirror 41. On the other hand, the p-polarized second infrared laser light La21 emitted from the 2-1 fiber amplifier 24, passes through the polarization beam combiner 43, then being coaxially superposed on the second infrared laser light La22, enters the dichroic mirror 41.

As stated above, the dichroic mirror 41 is configured to have a wavelength selectivity as it reflects a light in a wavelength band of the first ultraviolet laser light Lv1 and passes through a light in a wavelength band of the second infrared laser light La2. Therefore, after entering the dichroic mirror 41, the coaxially superposed, p-polarized second infrared laser light La21 and s-polarized infrared laser light La22 pass through the dichroic mirror 41, then enter the wavelength conversion optical element 35 of the second wavelength conversion optical system 30b, being coaxially superposed further on the first ultraviolet laser light Lv1.

The subsequent process of the wavelength-conversion is the same as the ultraviolet laser device LS1 described above. Namely, in the wavelength conversion element 35, the s-polarized second ultraviolet laser light Lv2 with a wavelength of 240.1 nm is generated by sum frequency generation of the p-polarized first ultraviolet laser light Lv1 with a wavelength of 310 nm and the p-polarized second infrared laser light La21 with a wavelength of 1065 nm. Here, as the effective non-linear optical constant of the ADP crystal is relatively high, the second ultraviolet laser light Lv2 is generated efficiently. Also, for phase matching, the non-critical phase matching (NCPM) prevents the generation of walk-off. Therefore, the second ultraviolet laser light Lv2 of excellent beam quality can be obtained efficiently, and, the spatial superposition of the second ultraviolet laser light Lv2 generated at the wavelength conversion optical element 35 and the second infrared laser light La22 transmitted through the wavelength conversion optical element 35 is maintained in an excellent condition.

Herewith, without providing optical elements such as a beam forming optical system and a wave plate between the wavelength conversion optical element 35 and the wavelength conversion optical element 36 where the wavelength band is in the ultraviolet region, the efficient wavelength-conversion can be done by the wavelength conversion optical element 36 of the next stage. The s-polarized second ultraviolet laser light Lv2 generated at the wavelength conversion optical element 35 and the s-polarized second infrared laser light La22 transmitted through the wavelength conversion optical element 35 enter the wavelength conversion optical element 36.

In the wavelength conversion element 36, the p-polarized deep ultraviolet laser light Lo with a wavelength of 195.9 nm is generated by sum frequency generation of the s-polarized second ultraviolet laser light Lv2 with a wavelength of 240.1 nm and the s-polarized second infrared laser light La22 with a wavelength of 1065 nm. Here, as the effective non-linear optical constant of the CLBO crystal is high, the deep ultraviolet laser light Lo is generated efficiently. Also, for phase matching, the non-critical phase matching (NCPM) prevents the generation of walk-off. Therefore, the deep ultraviolet laser light Lo of excellent beam quality can be obtained efficiently. Herewith, without providing a beam forming optical system in the emitting side of the wavelength conversion optical element 36 where the wavelength band is in a deep ultraviolet region with a wavelength below 200 nm, the deep ultraviolet laser light Lo of excellent quality can be output.

The deep ultraviolet laser light Lo with a wavelength of 195.9 nm generated at the wavelength conversion optical element 36, is emitted from the second wavelength conversion optical system 30b, then is output from the ultraviolet laser device LS2.

In the ultraviolet laser device LS2, the p-polarized second infrared laser light La21 and the s-polarized second infrared laser light La22 are amplified by the fiber amplifier 24 and 25, respectively. Then each light, as an independent beam, is output from the second laser light output unit 1b. Therefore, the ultraviolet laser device LS2 has advantageous effects described below in addition to the effects described for the ultraviolet laser device LS1. In the process of the wavelength-conversion at the wavelength conversion optical element 35 and in the process of the wavelength-conversion at the wavelength conversion optical element 36, necessary and sufficient second infrared laser lights, for each process, can be provided. Additionally, as each beam can be aligned independently, the superposition of the first ultraviolet laser light Lv1 and the p-polarized second infrared laser light La21 at the wavelength conversion optical element 35, and the superposition of the 240.1 nm light and the s-polarized second infrared laser light La22 at the wavelength conversion optical element 36 can be optimally adjusted. Thus, the deep ultraviolet laser light Lo can be output more efficiently.

Configuration Example #3

Figure 4:
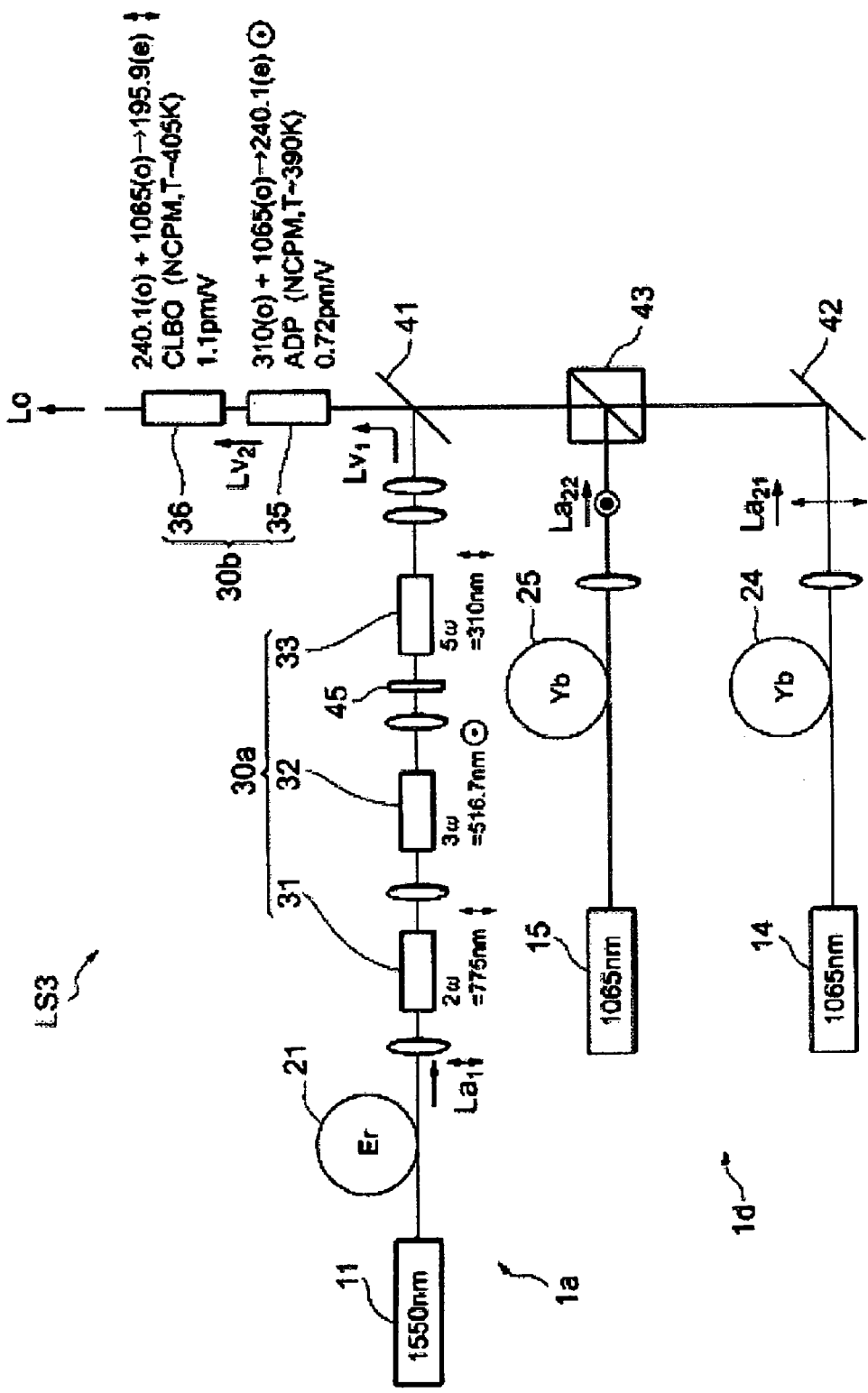
FIG. 4 is a schematic configuration diagram of an ultraviolet laser device of a third configuration example.

Next, with reference to FIG. 4, the ultraviolet laser device LS3 as a third configuration example is described. The ultraviolet laser device LS3 as the third configuration example is the same as the ultraviolet laser device LS1 as the first configuration example and the ultraviolet laser device LS2 of the second configuration example described above, except the configuration of the second laser light output unit. Further, the ultraviolet laser device LS3 is the same as the ultraviolet laser device LS2 as the second configuration example, except the second laser light output unit comprising two laser sources. Then, to similar structural elements in FIG. 4, the same reference symbols are appended, and duplicated explanation is omitted. In the following, the ultraviolet laser device LS3 as the third configuration example is described briefly with a focus on the second laser light output unit 1d.

The second laser light output unit 1d is configured to be provided with a 2-1 laser light source 14 that emits a seed light with a wavelength of 1065 nm, a 2-1 fiber amplifier 24 that amplifies the seed light output from the 2-1 laser source 14, a 2-2 laser source 15 that emits a seed light with a wavelength of 1065 nm, and a 2-2 fiber amplifier 25 that amplifies the seed light output from the 2-2 laser source 15.

Both of the 2-1 laser source 14 and the 2-2 laser source 15 are light sources emitting a seed light with a wavelength of 1065 nm, for which DFB semiconductor lasers with a oscillation wavelength of around 1065 nm can suitably be used.

Ytterbium doped fiber amplifiers (YDFA) can suitably be used as the 2-1 fiber amplifier and the 2-2 fiber amplifier. And, polarization maintaining fiber (PMF) can suitably be used as amplifying fibers in the fiber amplifiers 24 and 25.

The seed light emitted from the 2-1 laser source 14 is amplified by the 2-1 fiber amplifier 24, and the seed light emitted from the 2-2 laser light source 15 is amplified by the 2-2 fiber amplifier 25, then these two linearly-polarized second infrared laser lights La21 and La22 are output from the laser light output unit 1d. Namely, the second laser light output unit 1d of the present configuration example is provided with two sets of combination of the laser light source that emits the linearly-polarized second infrared laser light with a wavelength of 1065 nm and the fiber amplifier. Also, at least one of these sets of the combination of the laser light source and the fiber amplifier may be provided with a fiber laser (a Yb fiber laser) in which resonators are embedded in the incident end and the exiting end of it, without providing a light source.

The second infrared laser light La21 emitting from the 2-1 fiber amplifier 24, and the second infrared laser light La22 emitting from the 2-2 fiber amplifier 25 are adjusted to enter the dichroic mirror 41 as a p-polarized light and an s-polarized light, respectively. A specific means for the adjustment is the same as described above for the ultraviolet laser device LS2 as the second configuration example. The second infrared laser light La22 emitted from the 2-2 fiber amplifier 25 and adjusted to be an s-polarized light, enters the polarization beam combiner 43, while the second infrared laser light La21 emitted from the 2-1 fiber amplifier 24 and adjusted to be a p-polarized light, by way of the mirror 42, enters the polarization beam combiner 43, being coaxially superposed on the polarized beam combiner 43.

As stated above, the polarization beam combiner 43 is a polarization optical element that reflects an s-polarized component of the light and transmits a p-polarized component of the light in a wavelength band of 1065 nm. Therefore, the s-polarized second infrared laser light La22 emitted from the 2-2 fiber amplifier 25, is reflected by the polarization beam combiner 43, and then enters the dichroic mirror 41. On the other hand, the p-polarized second infrared laser light La21 emitted from the 2-1 fiber amplifier 24, passes through the polarization beam combiner 43, and then being coaxially superposed on the second infrared laser light La22, enters the dichroic mirror 41.

The subsequent process of the wavelength-conversion by the wavelength conversion optical elements 35 and 36 are the same as the ultraviolet laser device LS1 and the ultraviolet laser device LS2 described above.

In the ultraviolet laser device LS3, the p-polarized second infrared laser light La21 and the s-polarized second infrared laser light La22 are amplified and generated by each set of the laser source and the fiber amplifier, they can be operated independently, and each of the light, as an independent beams, are respectively output from the second laser light output unit 1d. Therefore, the ultraviolet laser device LS3 has the same advantageous effects as that of the ultraviolet laser device LS2. In addition, in the ultraviolet laser device LS3, as the 2-1 laser light source 14 which is a seed light source of the p-polarized second infrared laser light La21, and the 2-2 laser source 15 which is a seed light source of the s-polarized second infrared laser light La22, are provided individually, the timing of the generation of these second infrared laser lights La21 and La22 can be adjusted flexibly. Thus, even in the case that the spatial pulse length of the first ultraviolet laser light Lv1, the second infrared laser lights La21 and La22 or the like at the wavelength conversion optical elements 35 and 36, is as short as several millimeters for example, the deep ultraviolet laser light Lo is output efficiently with a proper superposition of these lights.

In the configuration examples of #1~#3 described above, a specific configurations are exemplified in which the wavelength of the first infrared laser light La1 output from the first laser light output unit 1a is set at 1550 nm, the wavelengths of the second infrared laser lights La2, La21 and La22 output from the second laser light output unit 1b are set at 1065 nm, and the deep ultraviolet laser light Lo output from the wavelength conversion unit 3 is set at 195.9 nm. However, the present invention is not restricted by the specific examples; the wavelength of the first infrared laser light, the wavelength of the second infrared laser light, the wavelength of the deep ultraviolet laser light, the configurations of the first wavelength conversion optical system 30a and the second wavelength conversion optical system 30b or the like can be appropriately changed as long as walk-off is not generated, or even if generated, the walkoff angle is smaller than 20 mrad or so and its effect is substantially small, at the wavelength conversion optical element 35 of the second wavelength conversion optical system 30b. If walk-off at the wavelength conversion optical element 35 is small enough, it is not necessary to provide a beam forming optical system between the wavelength conversion optical elements 35 and 36, and then the present invention still has the advantageous effect of efficient output of the deep ultraviolet laser light Lo.

The ultraviolet laser devices LS (LS1~LS3) described above are an easily-handled, small and lightweight devices with simple configurations, and they can suitably be used for the system such as optical processing devices like exposure devices or optical shaping apparatuses, inspection devices for a photomask or a wafer, observation devices like microscopes or telescopes, measurement devices like length measurement instruments or shape measurement instruments and optical therapy devices.

Figure 5:
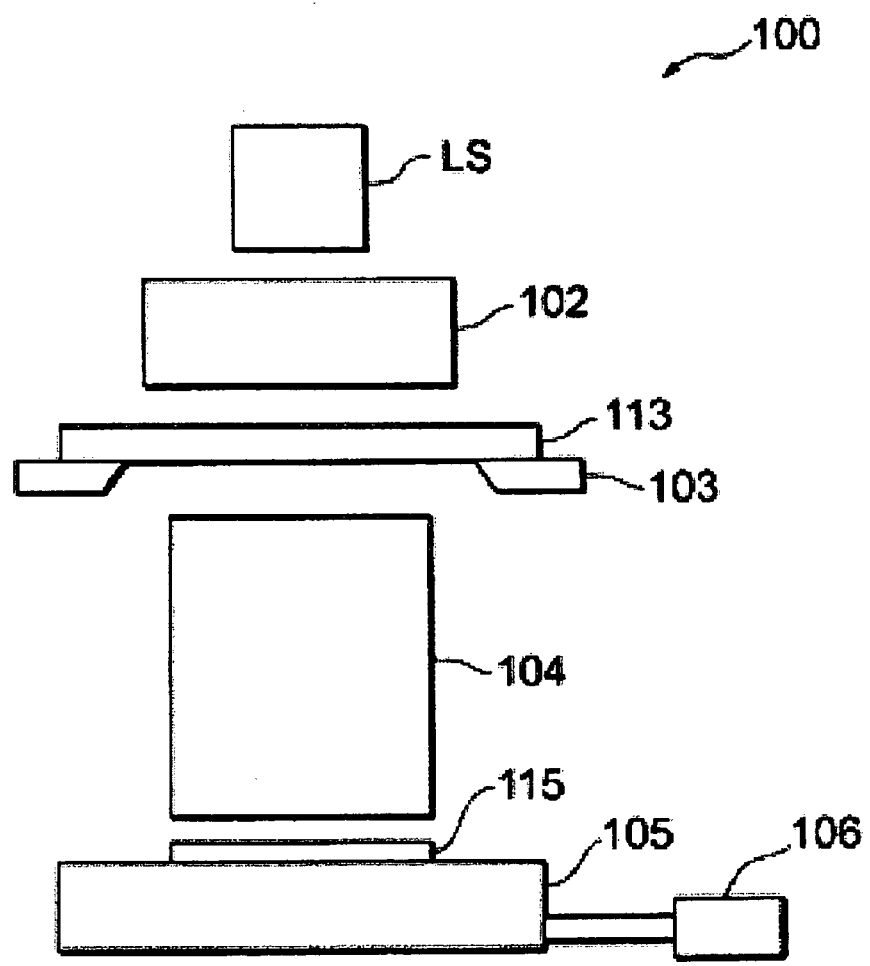
FIG. 5 is a schematic configuration of an exposure device exemplified as an aspect of the present invention.

An exposure device used in a lithography process of manufacturing semiconductor devices, liquid crystal panels or the like is described with reference to FIG. 5 showing the schematic configuration, as the first application example. The exposure device 100 optically projects a pattern drawn precisely on a photomask 113 made of silica glass on an exposure object 115 such as a semiconductor wafer or a glass substrate coated with a photoresist, that is the same as photoengraving in principle.

The exposure device 100 is configured to be provided with the ultraviolet laser device LS described above, an illumination optical system 102, a mask supporting base 103 that holds the photomask 113, a projection optical system 104, an exposure object supporting table 105 that holds the exposure object 115 and a driving mechanism 106 which moves the exposure object supporting table 105 in a horizontal plane. The illumination optical system 102 comprising a plurality of lens groups illuminates the photo mask 113 held on the mask supporting base 103 with the deep ultraviolet laser light output from the ultraviolet laser device LS. The projection optical system 104 comprising a plurality of lens groups projects the light passed through the photomask 113 on the exposure object 115 on the exposure object supporting table.

In such configuration of the exposure device 100, the deep ultraviolet laser light output from the ultraviolet laser device LS is input to the illumination optical system 102, and then the photomask 113 held on the mask supporting base 103 is exposed to the deep ultraviolet laser light adjusted to the predetermined light flux. A pattern image formed on the photomask 113 is focused on the predetermined position of the exposure object 115 held on the exposure object supporting table 105 through the projection optical system 104. Thus, the pattern image on the photomask 113 is projected onto the exposure object 115 such as a semiconductor wafer or a glass substrate for liquid crystal panel at a predetermined magnification.

The exposure device 100 described above is provided with the ultraviolet laser device LS in a relatively simple configuration which can output a high-power, deep ultraviolet laser light Lo of high beam quality, and is expected to contribute to improvement of the throughput and the machining quality of the lithography process.

Figure 6:
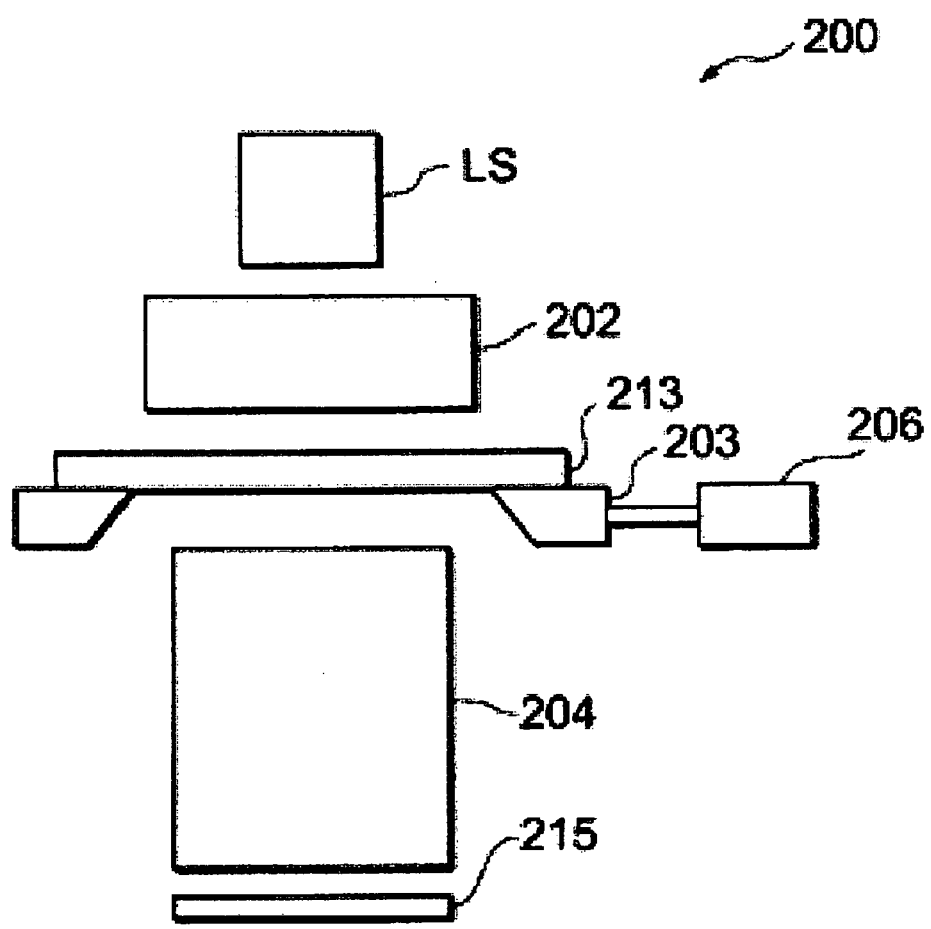
FIG. 6 is a schematic configuration of an inspection device exemplified as an aspect of the present invention.

An inspection device used in an inspection process of a photomask, a liquid crystal panel, a wafer, or the like (to be inspected) is described with reference to FIG. 6 showing the schematic configuration, as the second application example. The inspection device 200 can suitably be used for inspection of the precise pattern formed on an object 213 having optical transparency such as a photomask.

The inspection device 200 is configured to be provided with the ultraviolet laser device LS described above, an illumination optical system 202, an object supporting base 203 that holds the object 213, a projection optical system 204, a TDI (Time Delay Integration) sensor 215 that detects a light from the object 213, and a driving mechanism 206 which moves the object supporting base 203 in a horizontal plane. The illumination optical system 102 comprising a plurality of lens groups illuminates the object 213 held on the object supporting base 203 with the deep ultraviolet laser light output from the ultraviolet laser device LS. The projection optical system 204 comprising a plurality of lens groups projects the light transmitted through the object 213 to the TDI sensor 215.

In such configuration of the inspection device 200, the deep ultraviolet laser light output from the ultraviolet laser device LS is input to the illumination optical system 202, and then the object 213 such as a photomask held on the object supporting base 203 is exposed to the deep ultraviolet laser light adjusted to the predetermined light flux. A light from the object 213 (transmitted light in the configuration example) having a pattern image on the object 213 is projected and formed on the TDI sensor 215 through the projection optical system 204. At this time, the horizontal moving speed on the object supporting base 203 by the driving mechanism 206 and the transfer clock of the TDI sensor 215 are controlled in synchronization.

The pattern of the image on the object 213 is detected by the TDI sensor 215 and is compared with a predetermined reference image, thereby, in the case any defects exist on the pattern formed on the object, the defect can be extracted. In the case the object such as a wafer does not have the optical transparency, the reflected light from the object which enters the projection optical system 204 is guided to the TDI sensor 215 to realize a similar configuration.

The inspection device 200 described above is provided with the ultraviolet laser device LS with a relatively simple configuration which can output a high-power, deep ultraviolet laser light Lo of high beam quality, and is expected to contribute to improvement of the accuracy of an inspection and the shortening of an inspection time in the inspection process.

While various embodiments and variant examples have been explained in the above description, the present invention should not be considered as being limited by the details thereof. The scope of the invention includes the other embodiments within the scope of the technical ideas of the present invention.

The disclosures of the following priority patent application is hereby incorporated by reference:

Japanese Patent Application No. 2012-048210 (filed on Mar. 5, 2012).

The invention claimed is:

1. An ultraviolet laser device, comprising:
    a first laser light output unit that outputs a first infrared laser light with a first wavelength within a wavelength band of 1520 to 1580 nm;
    a second laser light output unit that outputs a second infrared laser light with a second wavelength within a wavelength band of 1020 to 1100 nm;
    a first wavelength conversion optical system that includes a plurality of wavelength conversion optical elements and generates a first ultraviolet laser light which is a fifth harmonic with a wavelength of ⅕ of the first wavelength of the first infrared laser light by sequentially wavelength converting, by the plurality of wavelength conversion optical elements, the first infrared laser light output from the first laser light output unit; and
    a second wavelength conversion optical system to which the first ultraviolet laser light generated by the first wavelength conversion optical system and the second infrared laser light with the second wavelength output from the second laser light output unit enter,
    wherein the second wavelength conversion optical system comprises a first wavelength conversion optical element that generates a second ultraviolet laser light by sum frequency generation of the first ultraviolet laser light and the second infrared laser light with the second wavelength, and a second wavelength conversion optical element that generates a deep ultraviolet laser light with a wavelength equal to or less than 200 nm by sum frequency generation of the second ultraviolet laser light and the second infrared laser light with the second wavelength.

2. The ultraviolet laser device according to claim 1, wherein:
    the second infrared laser light with the second wavelength output from the second laser light output unit includes a first polarization component and a second polarization component, wherein a plane of polarization of the first polarization component and a plane of polarization of the second polarization component are mutually orthogonal;
    the first wavelength conversion optical element generates the second ultraviolet laser light by sum frequency generation of the first ultraviolet laser light and the first polarization component of the second infrared laser light with the second wavelength; and
    the second wavelength conversion optical element generates the deep ultraviolet laser light by sum frequency generation of the second ultraviolet laser light and the second polarization component of the second infrared laser light with the second wavelength.

3. The ultraviolet laser device according to claim 1, wherein the first wavelength conversion optical element is an ADP crystal.

4. The ultraviolet laser device according to claim 1, wherein phase matching at the first wavelength conversion optical element is non-critical phase matching.

5. The ultraviolet laser device according to claim 1, wherein the second wavelength conversion optical element is a CLBO crystal.

6. The ultraviolet laser device according to claim 1, wherein phase matching at the second wavelength conversion optical element is non-critical phase matching.

7. The ultraviolet laser device according to claim 1, wherein the first laser light output unit comprises an erbium doped fiber amplifier.

8. The ultraviolet laser device according to claim 1, wherein the second laser light output unit comprises an ytterbium doped fiber amplifier.

9. The ultraviolet laser device according to claim 2, wherein:
    the second laser light output unit further comprises a laser light source that emits a seed light with the second wavelength within the wavelength band of 1020 to 1100 nm and a fiber amplifier that amplifies the seed light emitted from the laser light source; and
    a light with the second wavelength emitted from the fiber amplifier becomes the second infrared laser light including the first polarization component and the second polarization component, and then is output from the second laser light output unit.

10. The ultraviolet laser device according to claim 2, wherein:

the second laser light output unit further comprises a laser light source that emits a seed light with the second wavelength within the wavelength band of 1020 to 1100 nm, a first fiber amplifier that amplifies the seed light emitted from the laser light source, and a second fiber amplifier that amplifies the seed light emitted from the laser light source; and a light with the second wavelength emitted from the first fiber amplifier becomes the second infrared laser light including the first polarization component and is output from the second laser light output unit; and a light with the second wavelength emitted from the second fiber amplifier becomes the second infrared laser light including the second polarization component and is output from the second laser light output unit.

11. The ultraviolet laser device according to claim 2, wherein:

the second laser light output unit further comprises a first laser light source that emits a first seed light with the second wavelength within the wavelength band of 1020 to 1100 nm, a first fiber amplifier that amplifies the first seed light emitted from the first laser light source, a second laser light source that emits a second seed light with the second wavelength within the wavelength band of 1020 to 1100 nm, and a second fiber amplifier that amplifies the second seed light emitted from the second laser light source;

a light with the second wavelength emitted from the first fiber amplifier becomes the second infrared laser light including the first polarization component and is output from the second laser light output unit; and a light with the second wavelength emitted from the second fiber amplifier becomes the second infrared laser light including the second polarization component and is output from the second laser light output unit.

12. An exposure device comprising:

the ultraviolet laser device according to claim 1;

a photomask supporting unit that holds a photomask on which a predetermined exposure pattern is formed;

an exposure object supporting unit that holds an exposure object;

an illumination optical system that illuminates the photomask held by the photomask supporting unit with the deep ultraviolet laser light output from the ultraviolet laser device; and a projection optical system that projects a light transmitted through the photomask to the exposure object held by the exposure object supporting unit.

13. An inspection device comprising:

the ultraviolet laser device according to claim 1;

an object supporting unit that holds an object to be inspected;

an illumination optical system that illuminates the object held by the object supporting unit with the deep ultraviolet laser light output from the ultraviolet laser device; and a projection optical system that projects a light from the object to a detector.

* * * * *